United States Patent
Fan et al.

(10) Patent No.: US 7,498,188 B2
(45) Date of Patent: Mar. 3, 2009

(54) CONTACTS FOR CMOS IMAGERS AND METHOD OF FORMATION

(75) Inventors: Xiaofeng Fan, Boise, ID (US); Richard A. Mauritzson, Meridian, ID (US); Howard E. Rhodes, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 547 days.

(21) Appl. No.: 11/213,935

(22) Filed: Aug. 30, 2005

(65) Prior Publication Data

US 2006/0043436 A1 Mar. 2, 2006

Related U.S. Application Data

(60) Provisional application No. 60/606,520, filed on Sep. 2, 2004.

(51) Int. Cl.
*H01L 21/00* (2006.01)
(52) U.S. Cl. ............... 438/60; 438/197; 438/199
(58) Field of Classification Search ........... 438/60, 438/197, 199
See application file for complete search history.

(56) References Cited

U.S. PATENT DOCUMENTS

| | | | |
|---|---|---|---|
| 4,892,844 A | 1/1990 | Cheung et al. | |
| 6,010,961 A | 1/2000 | Hu | |
| 6,204,524 B1 * | 3/2001 | Rhodes | 257/222 |
| 6,291,280 B1 * | 9/2001 | Rhodes | 438/199 |
| 6,326,652 B1 * | 12/2001 | Rhodes | 257/231 |
| 6,376,368 B1 | 4/2002 | Jung et al. | |
| 6,429,470 B1 * | 8/2002 | Rhodes | 257/225 |
| 6,476,488 B1 | 11/2002 | Jeng et al. | |
| 6,495,434 B1 * | 12/2002 | Rhodes | 438/579 |
| 6,611,037 B1 * | 8/2003 | Rhodes | 257/466 |
| 6,630,701 B1 * | 10/2003 | Rhodes | 257/292 |
| 6,639,261 B2 * | 10/2003 | Rhodes | 257/291 |
| 6,730,980 B2 * | 5/2004 | Rhodes | 257/466 |
| 6,740,915 B1 * | 5/2004 | Rhodes | 257/291 |
| 6,767,759 B2 * | 7/2004 | Rhodes | 438/60 |
| 6,767,811 B2 * | 7/2004 | Rhodes | 438/579 |
| 6,838,742 B2 * | 1/2005 | Rhodes | 257/448 |
| 6,844,580 B2 * | 1/2005 | Rhodes | 257/291 |
| 6,852,591 B2 * | 2/2005 | Rhodes | 438/244 |
| 6,927,090 B2 * | 8/2005 | Rhodes | 438/59 |
| 6,960,796 B2 * | 11/2005 | Rhodes et al. | 257/222 |

(Continued)

OTHER PUBLICATIONS

Mendis, et al., "CMOS Active Pixel Image Sensor", IEEE Transactions on Electron Devices, vol. 41, No. 3, Mar. 1994, pp. 452-453.

(Continued)

*Primary Examiner*—Laura M Menz
(74) *Attorney, Agent, or Firm*—Dickstein Shapiro LLP

(57) ABSTRACT

Low leakage contacts on leakage sensitive areas of a CMOS imager, such as a floating diffusion region or a photodiode, are disclosed. At least one low leakage polysilicon contact is provided over a leakage sensitive area of a CMOS imager. The polysilicon contact comprises a polysilicon region in direct contact with the area of interest (the leakage sensitive area) and a metal region located over the polysilicon region. The polysilicon contact provides an improved ohmic contact with less leakage into the substrate. The polysilicon contact may be provided with other conventional metal contacts, which are employed in areas of the CMOS imager that do not require low leakage.

10 Claims, 9 Drawing Sheets

U.S. PATENT DOCUMENTS

| | | | | |
|---|---|---|---|---|
| 6,967,121 B2* | 11/2005 | Rhodes | | 438/73 |
| 7,037,771 B2* | 5/2006 | Rhodes | | 438/197 |
| 7,071,505 B2* | 7/2006 | Rhodes | | 257/292 |
| 7,091,059 B2* | 8/2006 | Rhodes | | 438/60 |
| 7,102,180 B2* | 9/2006 | Rhodes et al. | | 257/222 |
| 7,214,575 B2* | 5/2007 | Rhodes | | 438/197 |
| 7,224,009 B2* | 5/2007 | Rhodes | | 257/291 |
| 7,279,766 B2* | 10/2007 | Rhodes | | 257/461 |
| 7,368,339 B2* | 5/2008 | Rhodes | | 438/197 |
| 7,387,907 B2* | 6/2008 | Hsu et al. | | 438/59 |
| 7,397,075 B2* | 7/2008 | Rhodes | | 257/288 |
| 2002/0011614 A1* | 1/2002 | Rhodes | | 257/291 |
| 2002/0089004 A1* | 7/2002 | Rhodes | | 257/290 |
| 2002/0117690 A1* | 8/2002 | Rhodes | | 257/215 |
| 2003/0138985 A1* | 7/2003 | Rhodes | | 438/48 |
| 2003/0148570 A1* | 8/2003 | Rhodes | | 438/200 |
| 2003/0205741 A1* | 11/2003 | Rhodes | | 257/290 |
| 2004/0046104 A1* | 3/2004 | Rhodes | | 250/208.1 |
| 2004/0053436 A1* | 3/2004 | Rhodes | | 438/73 |
| 2004/0099886 A1* | 5/2004 | Rhodes et al. | | 257/222 |
| 2004/0104413 A1* | 6/2004 | Rhodes et al. | | 257/292 |
| 2004/0178323 A1* | 9/2004 | Rhodes | | 250/214.1 |
| 2004/0235216 A1* | 11/2004 | Rhodes | | 438/60 |
| 2004/0251482 A1* | 12/2004 | Rhodes | | 257/292 |
| 2005/0012124 A1* | 1/2005 | Rhodes | | 257/291 |
| 2005/0093038 A1* | 5/2005 | Rhodes | | 257/292 |
| 2005/0148114 A1* | 7/2005 | Rhodes | | 438/120 |
| 2005/0205905 A1* | 9/2005 | Rhodes | | 257/292 |
| 2005/0258457 A1* | 11/2005 | Rhodes et al. | | 257/222 |
| 2006/0014352 A1* | 1/2006 | Rhodes | | 438/305 |
| 2006/0105489 A1* | 5/2006 | Rhodes | | 438/48 |
| 2006/0183268 A1* | 8/2006 | Rhodes | | 438/98 |
| 2006/0183323 A1* | 8/2006 | Rhodes | | 438/655 |
| 2006/0214201 A1* | 9/2006 | Rhodes | | 257/292 |
| 2006/0273352 A1* | 12/2006 | Rhodes et al. | | 257/225 |
| 2008/0176350 A1* | 7/2008 | Rhodes | | 438/34 |

OTHER PUBLICATIONS

Nixon et al., "256 × 256 CMOS Active Pixel Sensor Camera-on-a-Chip", IEEE Journal of Solid-State Circuits, vol. 31, No. 12, Dec. 1996, pp. 2046-2050.

* cited by examiner

CONTACTS FOR CMOS IMAGERS AND METHOD OF FORMATION

This application claims the benefit of U.S. Provisional Application Ser. No. 60/606,520, filed on Sep. 2, 2004, the entire disclosure of which is incorporated by reference herein.

FIELD OF THE INVENTION

The invention relates to improved semiconductor imaging devices and, in particular, to CMOS imagers with low leakage contacts.

BACKGROUND OF THE INVENTION

Drawbacks of the so-called three-transistor (3T) pixel cell or four-transistor (4T) pixel cell of a CMOS imager relate to contact junction leakage, signal loss and contact defects which occur in the contact between a floating diffusion region formed in a substrate and a gate of a source follower output transistor. When a tungsten plug process (which is the current contact metallization of choice) is used to contact the floating diffusion region, tungsten is deposited with tungsten fluoride and a reaction typically takes place between the tungsten fluoride and the substrate. This reaction results in the formation of silicon fluoride which can create worm hole defects in the substrate. These worm holes create, in turn, a conductive channel for current to leak into the substrate. Since the size of the pixel electrical signal is very small due to the collection of photons in the photo array, the signal to noise ratio of the pixel should be as high as possible. Thus, leakage into the substrate reduces imager performance.

When tungsten is used in contact formation, conventional floating diffusion regions also typically have a n-type doped region (typically a phosphorous- or arsenic-implanted region) to facilitate an ohmic tungsten-semiconductor contact between the contact metallization and the underlying n-doped silicon region to achieve a good charge transfer to the source follower transistor.

Accordingly, resistance in the conductive path between the floating diffusion region and the gate of the source follower transistor should be as low as possible without resulting in added junction leakage. There is needed a new contact technology that provides a low contact resistance to a junction without causing the detrimental leakage mechanisms described above.

BRIEF SUMMARY OF THE INVENTION

The present invention provides low leakage contacts to substrate nodes that require low leakage, such as a floating diffusion region or a photodiode. While examples using the imager floating diffusion (FD) contact will be provided, it is to be understood that this technology applies to any technology that requires low leakage junctions to substrate. In particular, this invention is applicable to CCD imagers, CMOS imagers, DRAM, SRAM, FLASH, Micro-processors, and logic devices, among others. This invention is applicable to forming both contacts to N+ and P+ junctions.

In an exemplary embodiment of the invention, at least one low leakage polysilicon contact is provided over a leakage sensitive area of a CMOS imager, such as the floating diffusion region or the photodiode. The polysilicon contact comprises a polysilicon region in direct contact with the area of interest (the leakage sensitive area) and a metal region located over the polysilicon region. The polysilicon contact provides an improved ohmic contact with less leakage into the substrate. The polysilicon contact may also be provided in integrated circuit structures that have conventional metal contacts, which are employed in areas of the CMOS imager that do not require low leakage.

Other exemplary embodiments provide a method of forming single level polysilicon contacts to connect leakage sensitive areas of a CMOS imager, such as the floating diffusion region or the photodiode, to various other CMOS imager structures. The single level polysilicon contact process comprises the steps of: (i) selectively adding polysilicon to low-leakage contact areas; (ii) optionally not adding polysilicon to some contact areas (i.e., contact areas which are not leakage sensitive); (iii) adding metal to both the polysilicon in the leakage sensitive contact areas and to the remaining contact areas which are not leakage sensitive; and (iv) providing a metal contact metallization that is self-aligned to the low leakage polysilicon contact.

The above and other advantages and features of the invention will be more clearly understood from the following detailed description which is provided in connection with the accompanying drawings.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" and "substrate" in the following description, previous process steps may have been utilized to form regions or junctions in the base semiconductor structure or foundation. In addition, the semiconductor need not be silicon-based, but could be based on other single element or compound semiconductors such as germanium, silicon-germanium, gallium arsenide, or indium phosphide, among others.

Figure 1:
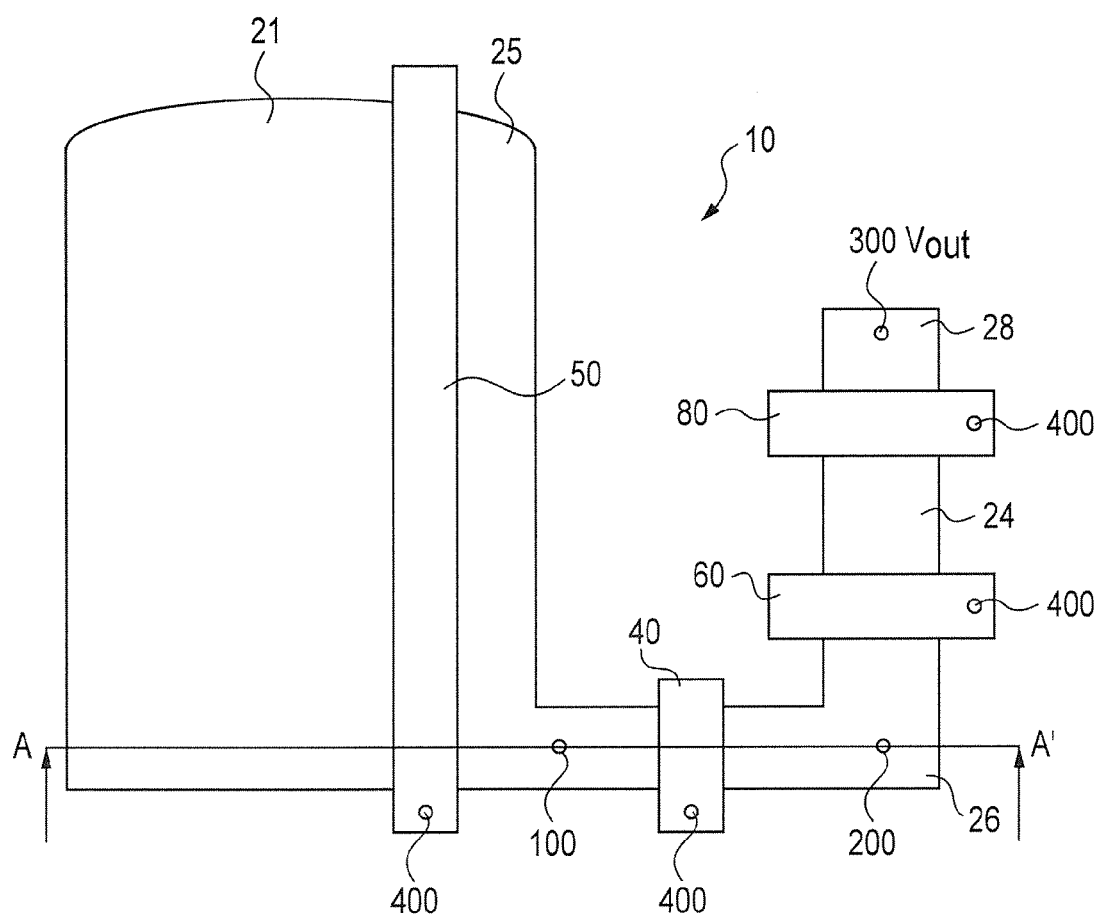
FIG. 1 is a top plan view of a CMOS image sensor pixel fabricated according to an embodiment of the present invention.

Referring now to the drawings, where like elements are designated by like reference numerals, a schematic top view of a portion of a semiconductor wafer fragment containing one exemplary CMOS pixel cell 10 comprising a self-aligned low leakage polysilicon contact 100 provided over a leakage sensitive area of the CMOS pixel cell is shown in FIG. 1. As explained in detail below, the low leakage polysilicon contact 100 is provided over a doped floating diffusion (FD) region 25 (a leakage sensitive region of the CMOS pixel cell 10), while a metal contact 200 is provided over a non-leakage sensitive doped region, Vaa supply voltage 26, of the CMOS pixel cell 10. Contact 300 to the signal output $V_{out}$ could be fabricated like the FD contact 100 or like the Vaa contact 200. Contacts 400 to the transistor gates could similarly be of either type.

Figure 14:
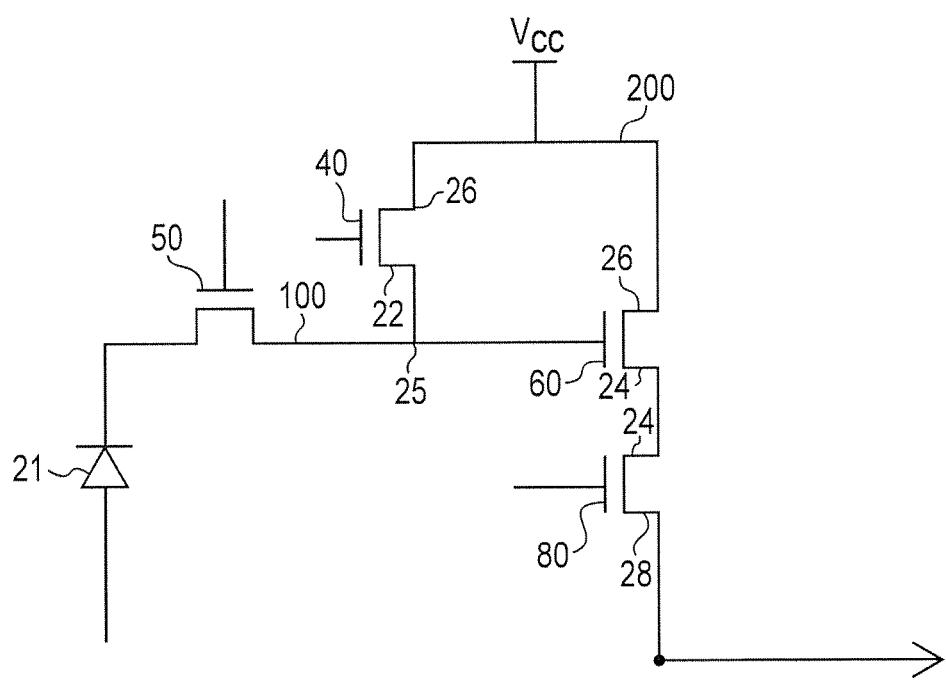
FIG. 14 is a schematic electrical diagram of the CMOS image pixel sensor cell of FIG. 1.

The CMOS pixel cell 10 of FIG. 1 is a four transistor (4T) cell implementing the electrical schematic circuit of FIG. 14. The CMOS pixel cell 10 comprises a charge collection region 21 for collecting charges generated by light incident on the pixel, and a transfer gate 50 for transferring photoelectric charges from the collection region 21 to a sensing node, typically a floating diffusion region 25. The floating diffusion region 25 is electrically connected to a gate 60 of an output source follower transistor. The pixel cell 10 also includes a gate 40 of a reset transistor for resetting the floating diffusion region 25 to a predetermined voltage before sensing a signal; a gate 60 of a source follower transistor which receives at its gate an electrical signal from the floating diffusion region 25; and a gate 80 of a row select transistor for selectively outputting a signal from the source follower transistor to output contact $V_{out}$ 300 in response to an address signal. Contacts 400 to the gate transistors are shown.

Figure 2:
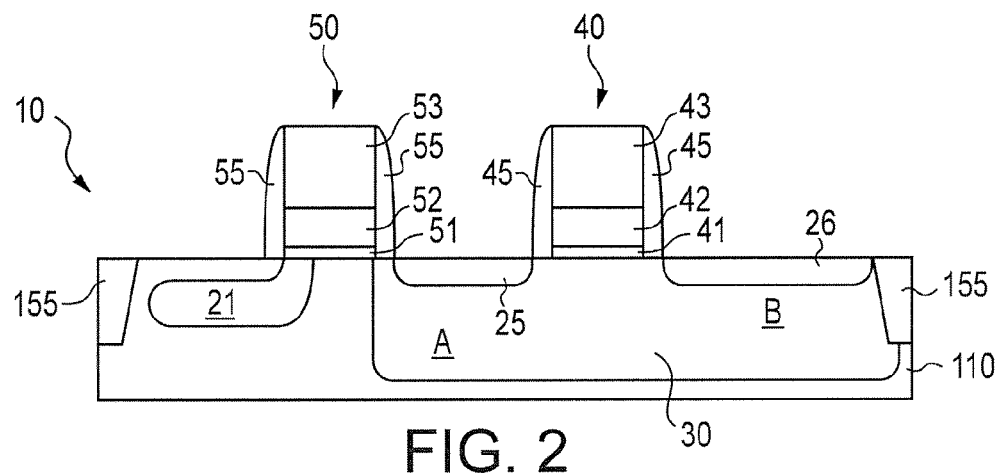
FIG. 2 is a schematic cross-sectional view of the CMOS image pixel of FIG. 1 taken along line A-A' illustrating the fabrication of a low leakage polysilicon contact in accordance with an embodiment of the present invention and at an initial stage of processing.

FIGS. 2-13 illustrate the formation of low leakage polysilicon contact 100 and metal contact 200 of FIG. 1. FIG. 2 is a diagrammatic sectional view of the pixel cell 10 of FIG. 1 taken along line A-A'. For exemplary purposes, substrate 110 of the CMOS pixel cell 10 is a silicon substrate lightly doped with a dopant of a first conductivity type, which for exemplary purposes is p-type. However, as noted above, the invention has equal application to other semiconductor substrates and to complementary structures. The dopant concentration in the p-type silicon substrate 110 is within the range of about $1 \times 10^{14}$ to about $1 \times 10^{16}$ atoms per $cm^3$, and is preferably within the range of about $5 \times 10^{14}$ to about $3 \times 10^{15}$ atoms per $cm^3$. Photolithography may be used to also define areas where p-wells 30 are implanted. Alternatively, if PMOS devices are to be formed, photolithography may be used to define areas where n-type wells are implanted (not shown).

As shown in FIG. 2, the exemplary CMOS pixel cell 10 has two different substrate regions A and B formed within substrate 110, respectively containing doped floating diffusion region 25 and doped region 26. Substrate region A is a low leakage region, that is, an area of the substrate 110 where low charge leakage is required and, for exemplary purposes only, includes floating diffusion region 25. A photodiode region 21 is also a low leakage region which, if electrical contact thereto is required, can also employ the same type of contacts as will be described below for region A. Substrate region B is a non-low leakage region of the substrate 110, that is, a region which is not sensitive to charge leakage. In a 4T pixel cell, doped region 26 is typically connected to a supply voltage Vaa.

FIG. 2 also illustrates a doped charge collection region 21 formed within substrate 110. The charge collection region 21 collects charges generated by light incident on the pixel and may be part of a photodiode, photoconductor, photogate, or other photosensing element. In an exemplary embodiment, the charge collection region 21 is a photodiode, for example, a pinned photodiode (PPD) which is adjacent to the gate 50 of a transfer transistor.

Also shown in FIG. 2 are isolation regions 155 which define a portion of a pixel and separate it from adjacent pixels. Isolation regions 155 are preferably shallow trench isolation (STI) regions, having a depth of about 1,000 to about 4,000 Angstroms and a width of about 500 to about 10,000 Angstroms. Preferably, isolation regions 155 are formed as trenches which contain a blanket-deposited dielectric material, which may be an oxide material, for example a silicon oxide such as SiO or $SiO_2$, oxynitride, a nitride material such as silicon nitride, silicon carbide, or other suitable dielectric materials. In a preferred embodiment, the dielectric material is a high density plasma (HDP) oxide, a material which has a high ability to effectively fill narrow trenches.

FIG. 2 also illustrates two multi-layered gates of two adjacent transistors of the CMOS pixel cell 10. For exemplary purposes only, the two multi-layered gates are transfer gate 50 (corresponding to a transfer transistor) and reset gate 40 (corresponding to a reset transistor) formed over the substrate 110. Each of the transfer and reset gates 50, 40 comprises a first gate insulator layer 51, 41 of grown or deposited silicon oxide or a high K dielectric on the substrate 110, a conductive layer 52, 42 of doped polysilicon, polysilicon and $WSi_x$, polysilicon and W, or other conductive material such as $WN_x$/W or a composite conductive sandwich structure, and a second insulating layer 53, 43 which may be formed of, for example, silicon oxide (silicon dioxide), nitride (silicon nitride), oxynitride (silicon oxynitride), ON (oxide-nitride), NO (nitride-oxide), or ONO (oxide-nitride-oxide), or other insulating materials. The first and second insulating layers 51, 41, 53, 43 and the conductive layer 52, 42 may be formed by conventional deposition methods, for example, chemical vapor deposition (CVD) or plasma enhanced chemical vapor deposition (PECVD), among many others. Insulating sidewall spacers 55, 45 are formed on the sidewalls of transistor gates 50, 40, as known in the art.

Figure 3:
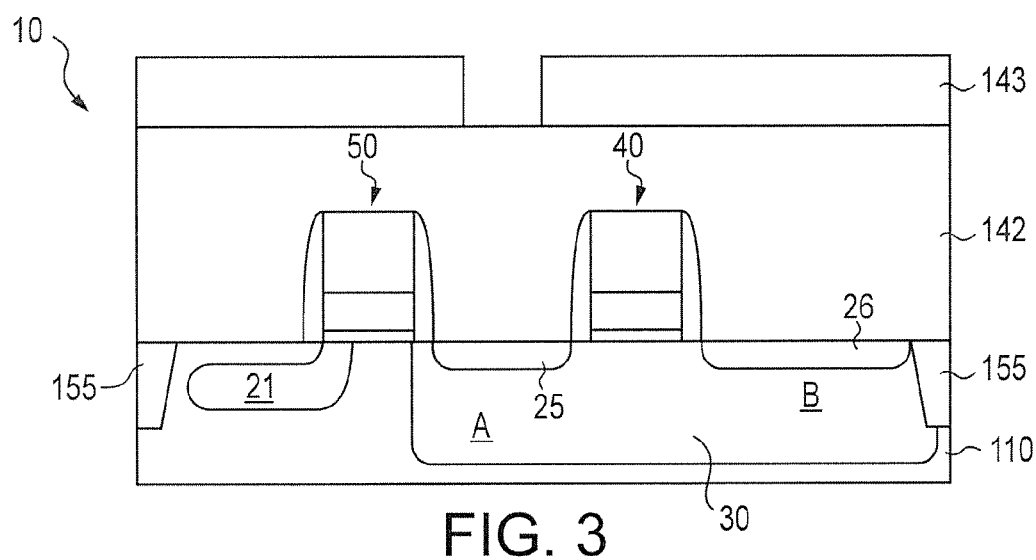
FIG. 3 is a schematic cross-sectional view of the CMOS image pixel of FIG. 2 and at a stage of processing subsequent to that of FIG. 2.
Figure 4:
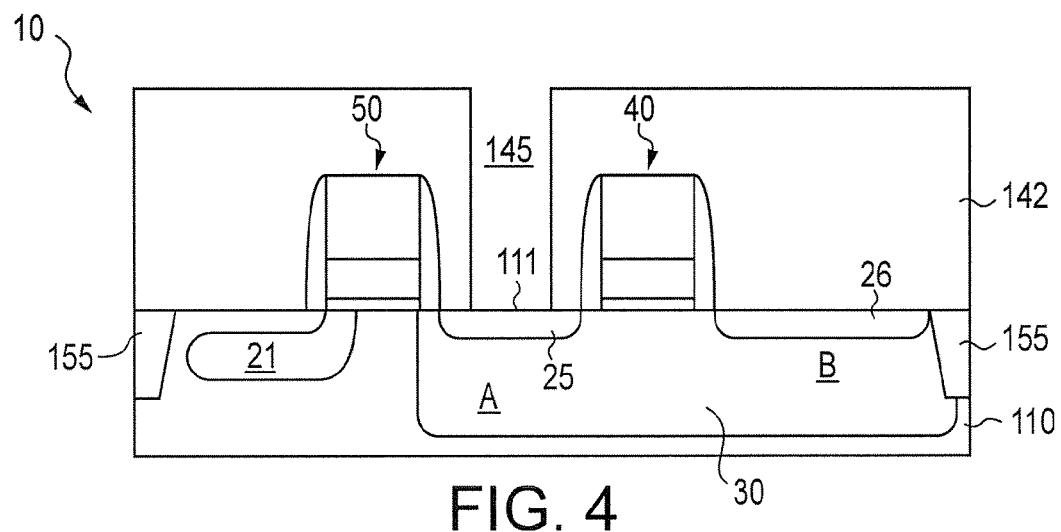
FIG. 4 is a schematic cross-sectional view of the CMOS image pixel of FIG. 2 and at a stage of processing subsequent to that of FIG. 3.
Figure 4A:
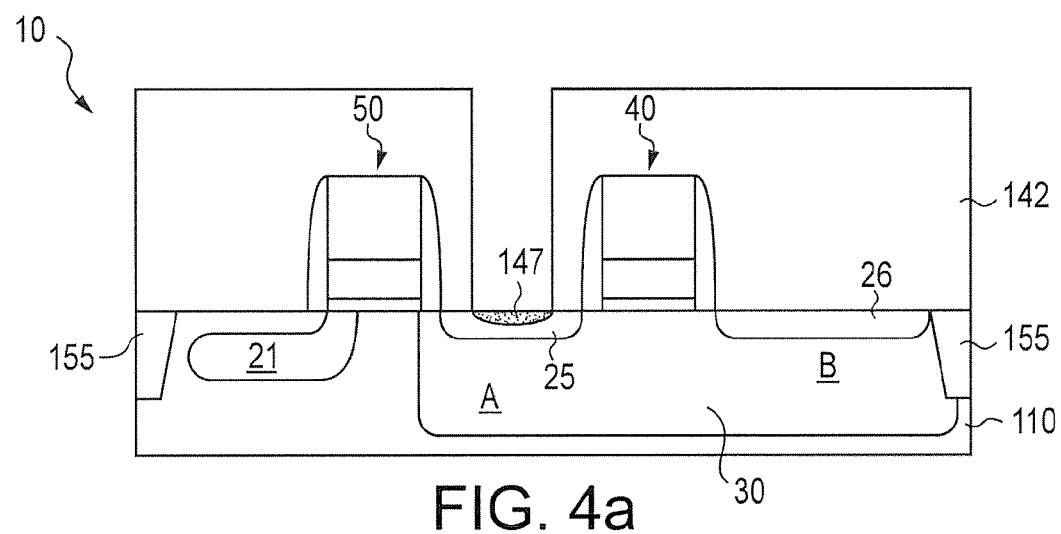
FIG. 4a is a schematic cross-sectional view of the CMOS image pixel of FIG. 2 and at a stage of processing subsequent to that of FIG. 3 and in accordance with another embodiment of the present invention.

Referring now to FIG. 3, subsequent to the formation of the doped regions 21, 25 and 26, of isolation regions 155 and of the transistor gates 50, 40, a layer of insulating material 142 is deposited over the substrate 110 and the transistor gates 50, 40. The insulating material preferably consists of borophosphosilicate glass (BPSG), but may also be phososilicate glass (PSG), borosilicate glass (BSG), undoped $SiO_2$, spin-on-glass (SOG), or the like. The insulating layer 142 may be formed by deposition methods, for example, chemical vapor deposition (CVD), plasma enhanced chemical vapor deposition (PECVD), or spin coating, among many others, to a thickness of about 2,000 Angstroms to about 50,000 Angstroms. The insulating layer 142 can be preferably subsequently planarized by chemical-mechanical polishing (CMP), for example, or other suitable planarization techniques. A first photoresist layer 143 (FIG. 3) and anisotropic plasma are subsequently used to selectively etch a first contact opening 145 through the first insulating layer 142 and to expose an upper surface 111 of the floating diffusion region 25 of the sensitive leakage region A, as shown in FIG. 4.

Figure 5:
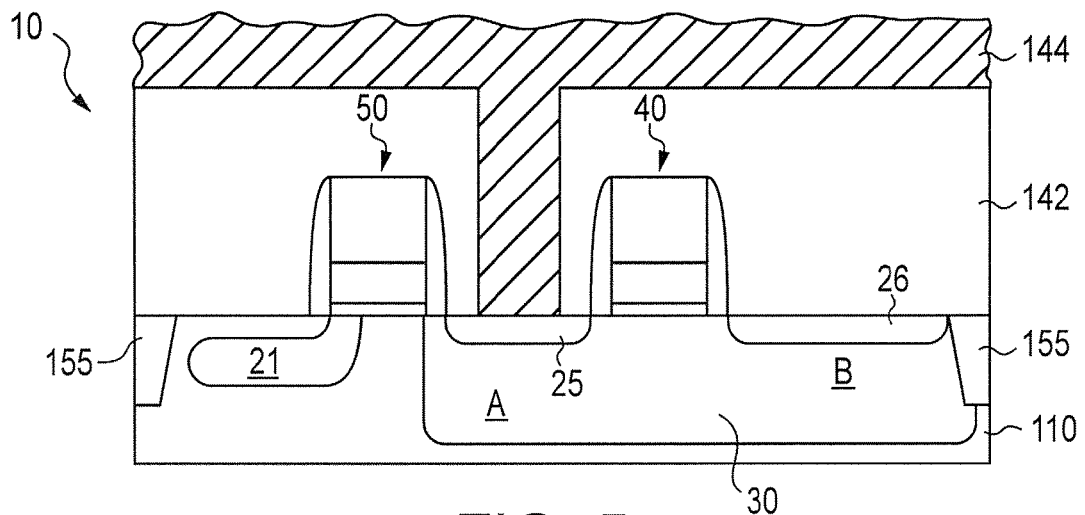
FIG. 5 is a schematic cross-sectional view of the CMOS image pixel of FIG. 2 and at a stage of processing subsequent to that of FIG. 4.
Figure 6:
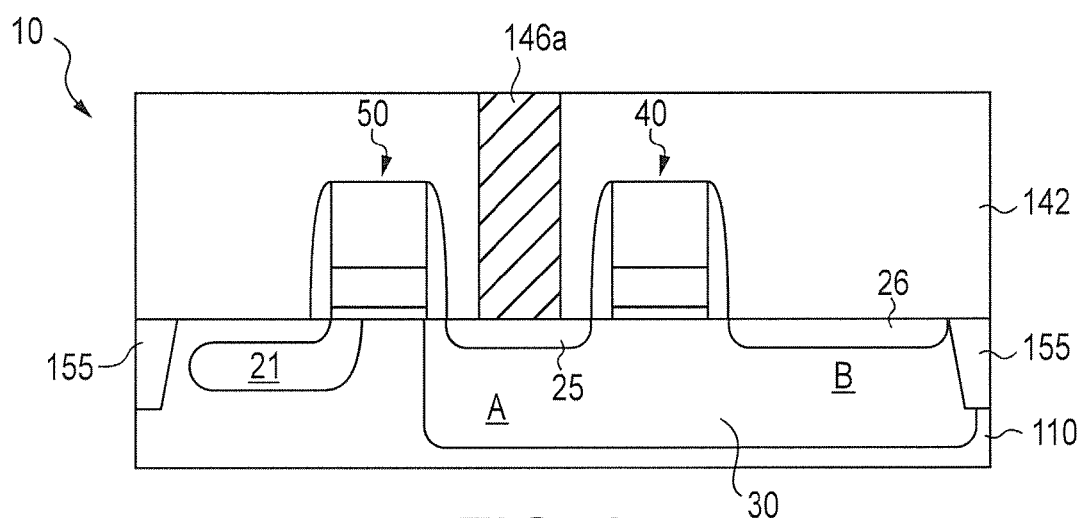
FIG. 6 is a schematic cross-sectional view of the CMOS image pixel of FIG. 2 and at a stage of processing subsequent to that of FIG. 5.
Figure 7:
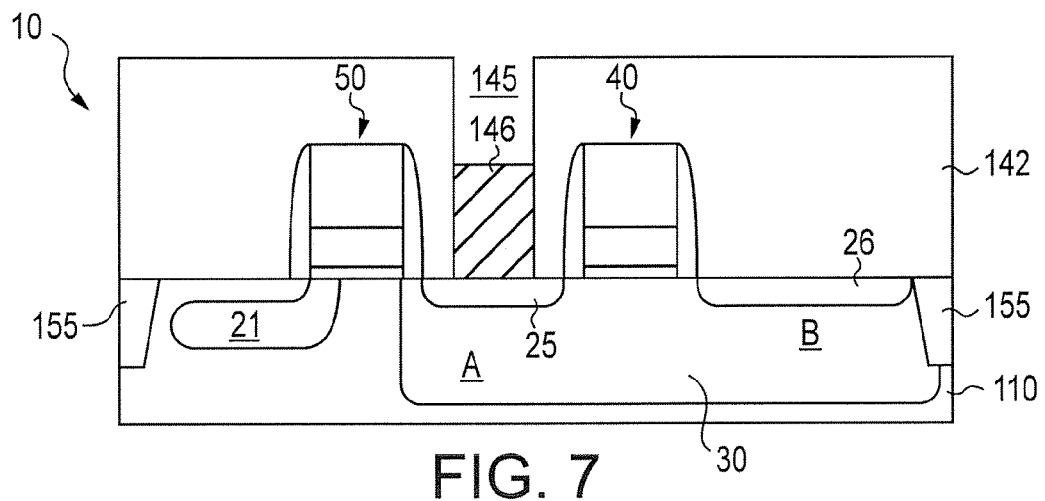
FIG. 7 is a schematic cross-sectional view of the CMOS image pixel of FIG. 2 and at a stage of processing subsequent to that of FIG. 6.

Referring now to FIG. 5, after removal of the first photoresist layer 143, an n+ doped polysilicon layer 144 is formed by deposition, for example, over the substrate 110 and within the first contact opening 145. The n+ doped polysilicon layer 144 may be deposited in situ by a low plasma chemical vapor deposition (LPCVD), for example, using $SiH_4$ as the reactant gas and including n-type dopants such as phosphorous (P), arsenic (As) or antimony (Sb). For example, n+ doped polysilicon layer 144 may be deposited in situ by LPCVD at a temperature of about 300° C. to about 700° C. using $SiH_4$ and phosphine ($PH_3$). The n+ doped polysilicon layer 144 is subsequently planarized (isolating the contacts from each other) by a plasma etch back or by chemical mechanical polishing (CMP) to form polysilicon plug 146a, as shown in FIG. 6. A polysilicon dry etch is then conducted to remove at least a portion of the polysilicon plug 146a and to form doped polysilicon region 146, as shown in FIG. 7. Although FIG. 7 illustrates doped polysilicon region 146 having a height about half the height of the polysilicon plug 146a, the invention is not limited to this embodiment. Accordingly, the dry etch may remove any portion of the polysilicon plug 146a to form the doped polysilicon region 146 having various heights. For example, the doped polysilicon region 146 may have a height of about 200 Angstroms to about 50,000 Angstroms.

Alternatively, undoped polysilicon may be first deposited and then doped by ion implantation with dopant or impurity atoms of a second conductivity type, which for exemplary purposes are of n-type conductivity for NMOS device fabrication. If undoped polysilicon is used, n-type dopants such as phosphorous (P), arsenic (As) or antimony (Sb) are subsequently implanted into the undoped polysilicon layer by using ion implantation, for example, to form the n+ doped polysilicon region 146. Ion implantation may be performed by placing the substrate 110 in an ion implanter and implanting appropriate dopant ions into the exposed undoped polysilicon layer. For example, phosphorous is introduced into the undoped polysilicon layer using ion implantation at an accelerated energy of about 1 keV to about 50 keV and a dose concentration of about $5\times10^{14}/cm^2$ to about $5\times10^{15}/cm^2$. A heat treatment such as an anneal treatment at about 600° C. to about 1000° C., may be optionally employed to activate the dopant within the n+ doped polysilicon region 146 of FIG. 7. As another embodiment, after the contact opening 145 is formed as shown in FIG. 4, an n-type implant 147 can be performed in the contact 145 and on the FD region 25, directly underneath the contact 145. This implant 147 can be tailored to optimize the junction doping for low leakage. This implant dose may be about $3\times10^{13}$ atoms/$cm^2$ to about $3\times10^{15}$ atoms/$cm^2$.

Although the present invention has been described above with reference to the formation of n+ doped polysilicon region 146 over the n-type doped region 25 for NMOS fabrication, the invention also has applicability to the formation of a p+ doped polysilicon region over a p+ doped region formed within an n-type well of the substrate 110. In this case, p-type dopant impurity ions, such as boron (B), boron fluoride ($BF_2$) or indium (In) are implanted into the undoped polysilicon to form a p+ doped polysilicon region for PMOS fabrication.

Figure 8:
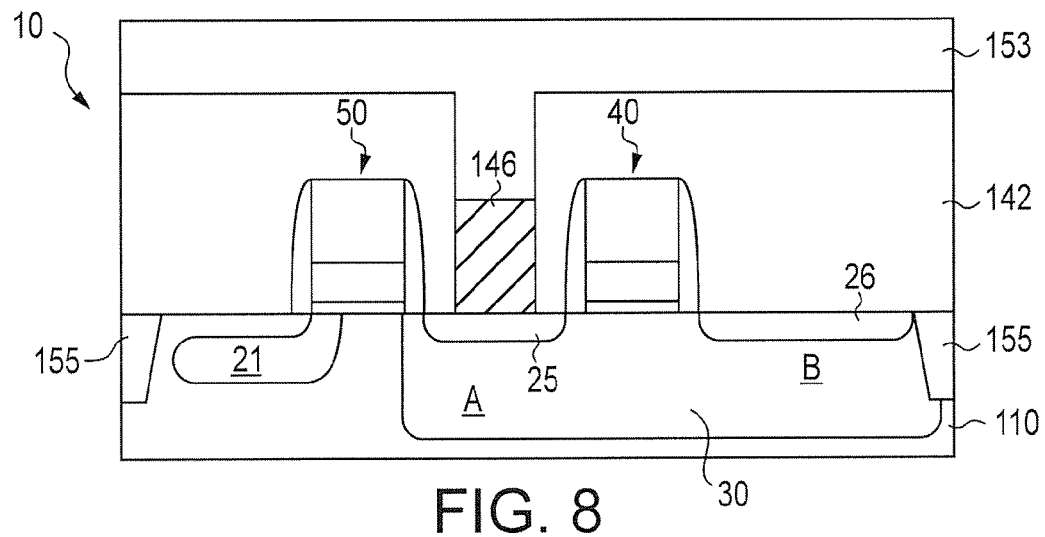
FIG. 8 is a schematic cross-sectional view of the CMOS image pixel of FIG. 2 and at a stage of processing subsequent to that of FIG. 7.
Figure 9:
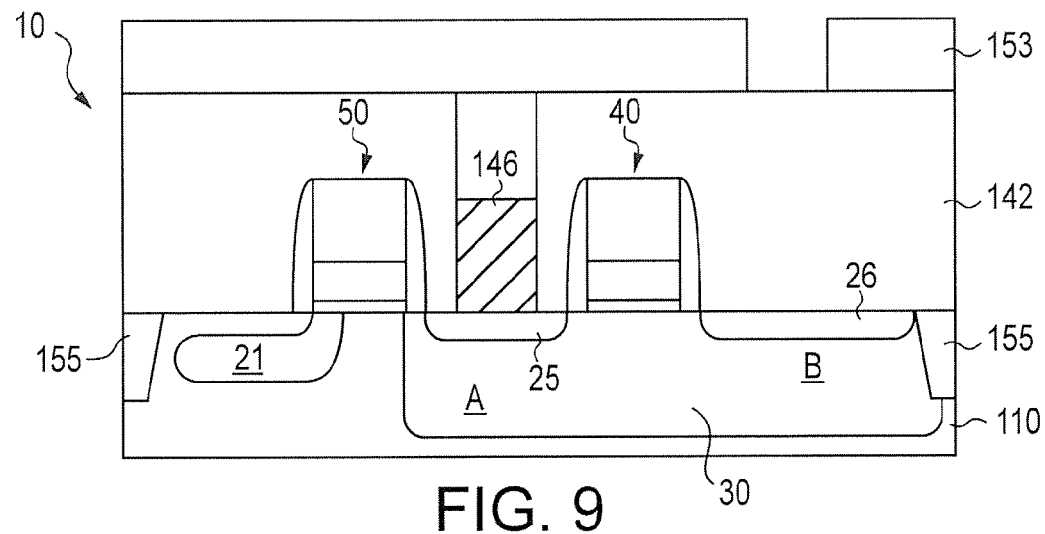
FIG. 9 is a schematic cross-sectional view of the CMOS image pixel of FIG. 2 and at a stage of processing subsequent to that of FIG. 8.
Figure 10:
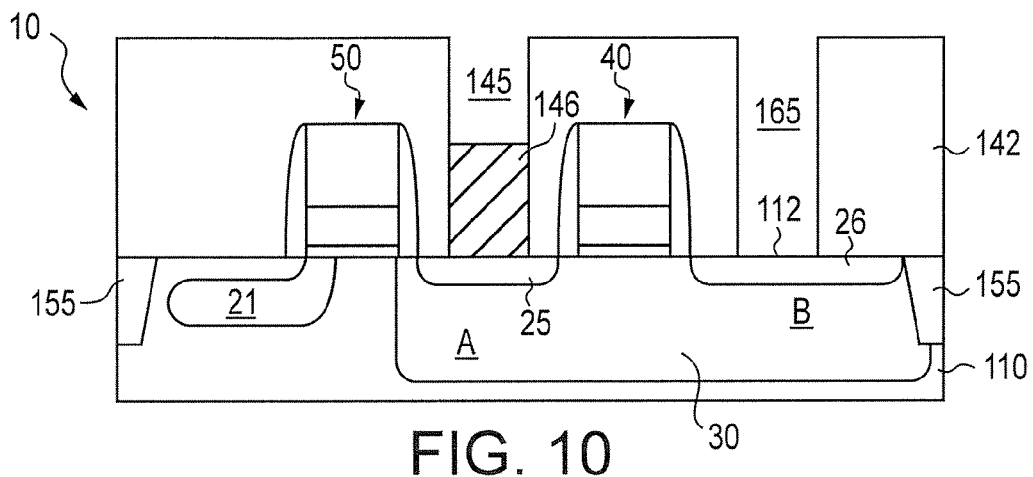
FIG. 10 is a schematic cross-sectional view of the CMOS image pixel of FIG. 2 and at a stage of processing subsequent to that of FIG. 9.
Figure 11:
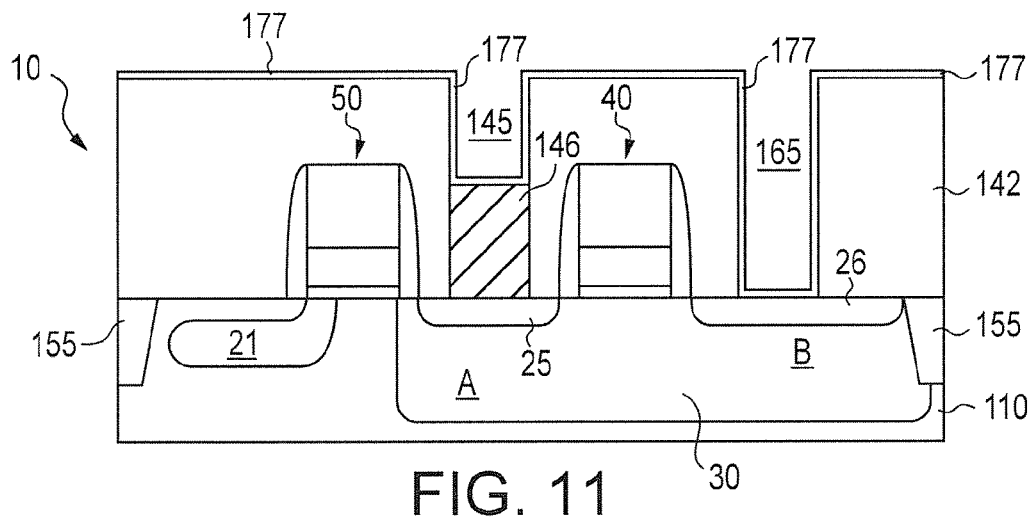
FIG. 11 is a schematic cross-sectional view of the CMOS image pixel of FIG. 2 and at a stage of processing subsequent to that of FIG. 10.

Reference is now made to FIG. 8. A second photoresist layer 153 is formed over the substrate 110 and within opening 145 (FIG. 7). The second photoresist layer 153 is patterned (FIG. 9) and an anisotropic plasma etch is then conducted to selectively etch a second contact opening 165 through the first insulating layer 142 and to expose an upper surface 112 of the non leakage sensitive region B of the substrate 110, as shown in FIG. 10. The second photoresist layer 153 is then removed (FIG. 10) and a barrier layer 177 is simultaneously formed by blanket deposition within the openings 145, 165, over the polysilicon region 146, and over surface 112 of the non leakage sensitive region B, and over the surface of the insulator 142, as shown in FIG. 11. The barrier layer 177 may be formed of titanium (Ti), titanium nitride (TiN), Ti/TiN, Ti—Si—N (titanium-silicon-nitride), TaNx (tantalum nitride), MoNx (molybdenum nitride) or WNx (tungsten nitride), for example, or combinations of such materials, among many others. The barrier layer 177 may be formed to a thickness of about 50 Angstroms to about 300 Angstroms.

Figure 12:
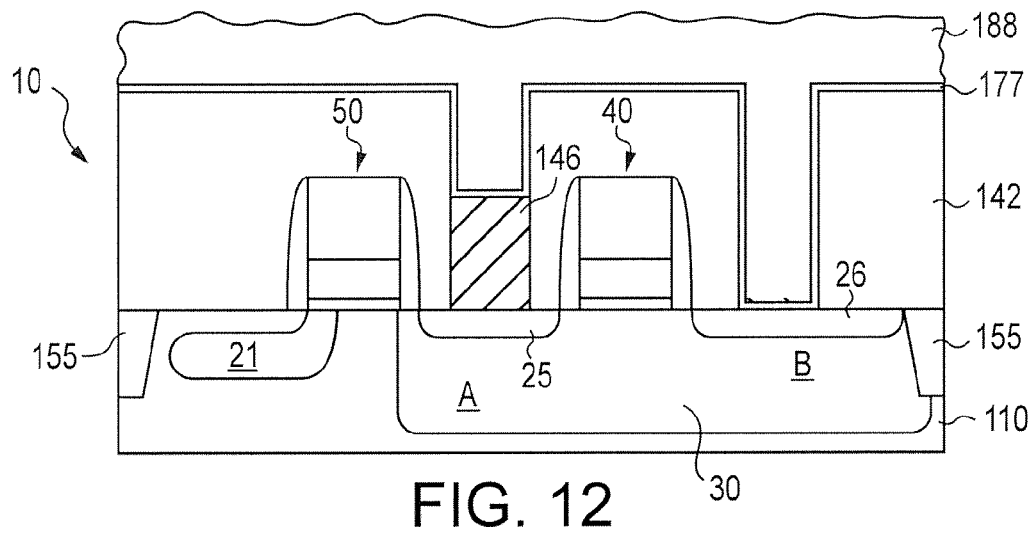
FIG. 12 is a schematic cross-sectional view of the CMOS image pixel of FIG. 2 and at a stage of processing subsequent to that of FIG. 11.
Figure 13:
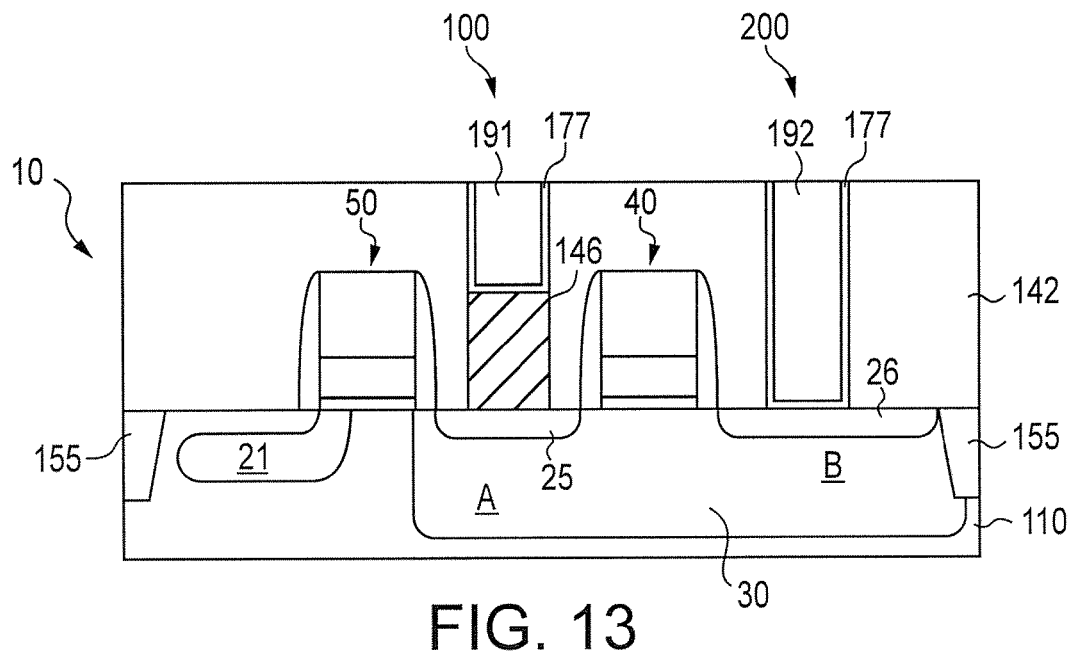
FIG. 13 is a schematic cross-sectional view of the CMOS image pixel of FIG. 2 and at a stage of processing subsequent to that of FIG. 12.

A metal layer 188 is then deposited, by blanket deposition, for example, in the openings 145, 165 and over the barrier layer 177, as shown in FIG. 12. The metal layer 188 may be formed of tungsten, titanium, or molybdenum, among many others. Chemical mechanical polishing (CMP) or any other planarization or etch-back technique is then employed to remove metal from metal layer 188 located over the upper surfaces of the insulating layer 142, and to form a low leakage polysilicon contact 100 provided over leakage sensitive area A of the pixel cell, and a metal contact 200 provided over non-leakage sensitive area B of the pixel cell, as shown in FIG. 13.

The low leakage polysilicon contact 100 is provided over floating diffusion region 25 (which is a leakage sensitive area of the CMOS pixel cell 10) while metal contact 200 is provided over non-leakage sensitive region B. The low leakage polysilicon contact 100 comprises the n+ doped polysilicon region 146 provided in direct contact with the floating diffusion region 25 and a metal region 191 provided over the n+ doped polysilicon region 146. By providing doped polysilicon material and not metal in direct contact with the leakage sensitive area A of the CMOS pixel cell 10, the leakage in area A of the CMOS pixel are greatly improved. The formation of low leakage polysilicon contact 100 of the present invention eliminates the need for a conventional highly n+ doped region (typically a phosphorous- or arsenic-implanted region) in the floating diffusion region when metal (not polysilicon) is employed to facilitate an ohmic metal-semiconductor contact between the contact metallization and the underlying substrate region.

The embodiments of the present invention described above are selective polysilicon contact processes, meaning that the low leakage polysilicon contacts of the present invention can be selectively chosen so that they are formed only over areas of interest, while conventional metal contacts (typically tungsten contacts) are formed anywhere else on the substrate. As explained above, the methods of the present invention also provide a parallel process for the simultaneous formation of both low leakage polysilicon contacts (such as the low leakage polysilicon contact 100 of FIGS. 1 and 13) and metal contacts (such as the metal contact 200 of FIGS. 1 and 13). In this manner, low leakage polysilicon contacts are simultaneously formed with the metal contacts, reducing the number of processing steps, eliminating poly/metal contact misalignment issues, and eliminating the need for the formation of additional dielectric and mask layers to form individually the polysilicon and metal contacts. In addition, since no formation of additional dielectric layers is required according to the method of the claimed invention, the actual height of the contacts can be maintained to a minimum.

After the formation of the low leakage polysilicon contact 100 and of the metal contact 200, the pixel cell 10 of the present invention is then processed according to known methods to produce an operative imaging device. For example, metallization and wirings may be provided, to connect gate lines and other connections in the pixel cell 10, and passivation layers may be deposited and openings may be etched to bond pads. The passivation layer may include materials such as TEOS, BPSG, PSG, BSG or the like. The imager is fabricated to arrive at an operational apparatus that functions similar to the imager depicted in FIG. 1. Details of the functions and attributes of the these CMOS imaging elements are generally known in the art and they are discussed in a multitude of references such as, for example, Nixon et al., "256×256 CMOS Active Pixel Sensor Camera-on-a-Chip," IEEE Journal of Solid-State Circuits, Vol. 31(12), pp. 2046-2050 (1996); and Mendis et al., "CMOS Active Pixel Image Sensors," IEEE Transactions on Electron Devices, Vol. 41(3), pp. 452-453 (1994), the disclosures of which are incorporated by reference herein.

While the invention is preferably directed to methods for forming imager devices with distinct self-aligned low leakage polysilicon contacts and metal contacts, and structures incorporating such low leakage polysilicon contacts and the metal contacts, one skilled in the art will recognize that the invention can be used to form any type of imager device for integration with one or more processing components in a semiconductor device. For example, although the invention is described above for use in a CMOS image sensor, the invention is not limited to such and may be used in any suitable image sensor, for example, CCD image sensors. This invention may also be used on logic devices like DRAM, FLASH, SRAM, Micro processors, and gate arrays. Further, this invention may be also used in the construction of analog devices such as RF devices.

The last (output) stage of a CCD image sensor provides sequential pixel signals as output signals, and uses a floating diffusion node, source follower transistor, and reset gate in a similar manner to the way these elements are used in the pixel of a CMOS imager. Accordingly, the pixel formed as described above may be employed in CCD image sensors as well as CMOS image sensors. The imager devices of the present invention may also be formed as different size megapixel imagers, for example imagers having arrays in the range of about 0.1 megapixels to about 20 megapixels.

Although the invention has been described above with reference to low leakage polysilicon contact 100 formed over a floating diffusion region of a four-transistor (4T) pixel cell, the invention may also be incorporated into a three-transistor (3T) cell, a five-transistor (5T) cell, a six-transistor (6T) cell or a seven-transistor (7T) cell, among others. As known in the art, a 3T cell differs from the 4T cell by the omission of the charge transfer transistor and associated gate, and the coupling of the n regions of the photodiode and the floating diffusion regions through an overlap of the two or an n region bridging the two, which is well known in the art. A 5T cell differs from the 4T cell by the addition of a shutter transistor, Anti-blooming transistor or a CMOS photogate transistor.

Further, although the invention has been described above with reference to the formation of transistor gates and low leakage polysilicon contacts as part of a CMOS imager, the invention has equal applicability to the formation of low leakage polysilicon contacts and transistors as part of a CCD imager, an imager with a global shutter transistor, a high dynamic range transistor or a storage gate, among others.

Figure 15:
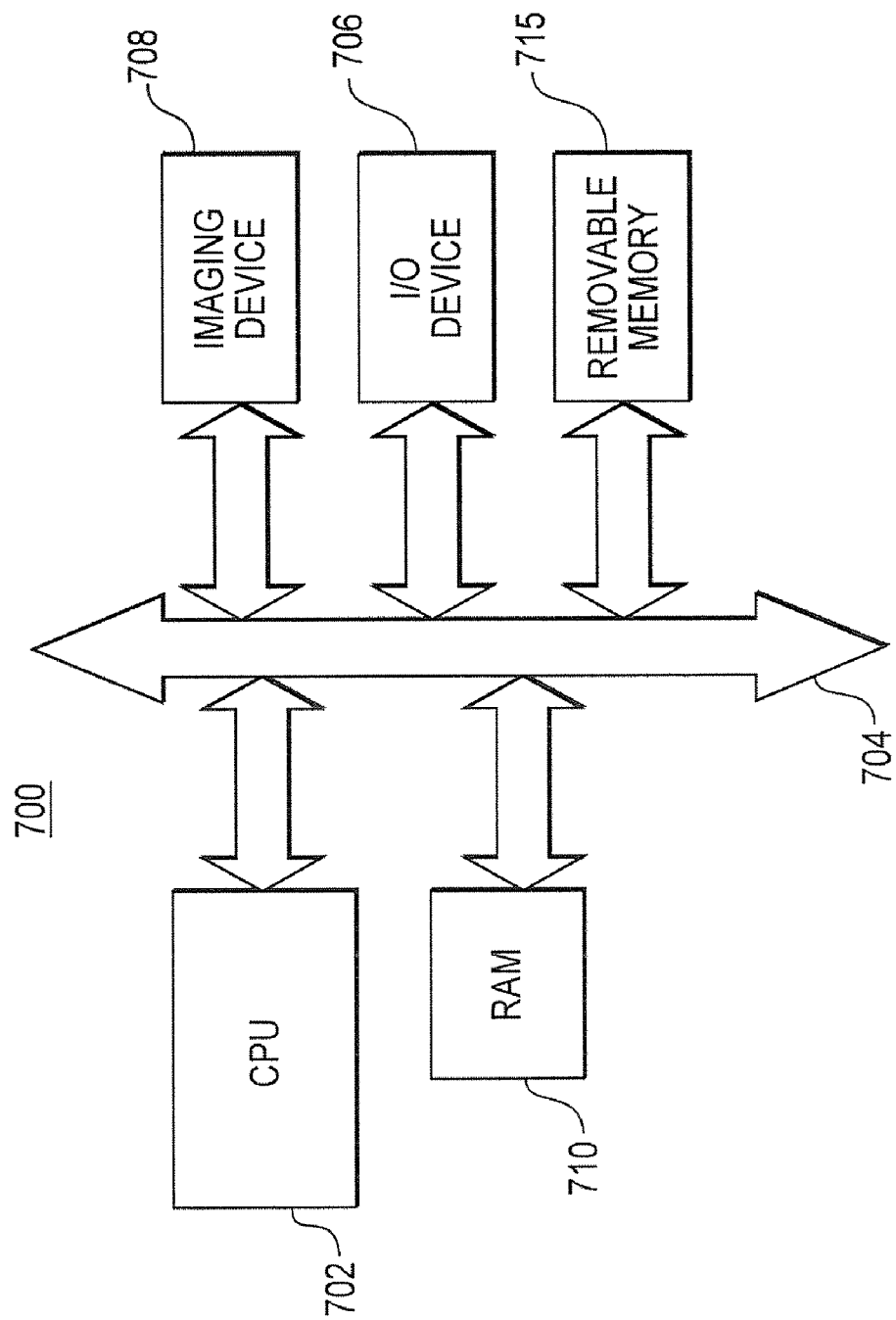
FIG. 15 illustrates a schematic diagram of a computer processor system which may utilize an imaging device, for example, a CMOS imaging device having a polysilicon contact constructed in accordance with one embodiment of the invention.

FIG. 15 illustrates system 700, a typical processor system modified to include an imaging device 708 containing a pixel array having pixels as constructed above and comprising low leakage polysilicon contacts (such as the low leakage polysilicon contact 100 of FIGS. 1 and 13) provided over leakage sensitive areas of the pixel 10. The processor-based system 700 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

System 700, for example a camera system, generally comprises a central processing unit (CPU) 702, such as a microprocessor, that communicates with an input/output (I/O) device 706 over a bus 704. Imaging device 708 also communicates with the CPU 702 over the bus 704. The processor-based system 700 also includes random access memory (RAM) 710, and can include removable memory 715, such as flash memory, which also communicate with the CPU 702 over the bus 704. The imaging device 708 may be combined with a processor, such as a CPU, digital signal processor, or microprocessor, with or without memory storage on a single integrated circuit or on a different chip than the processor.

Figure 16:
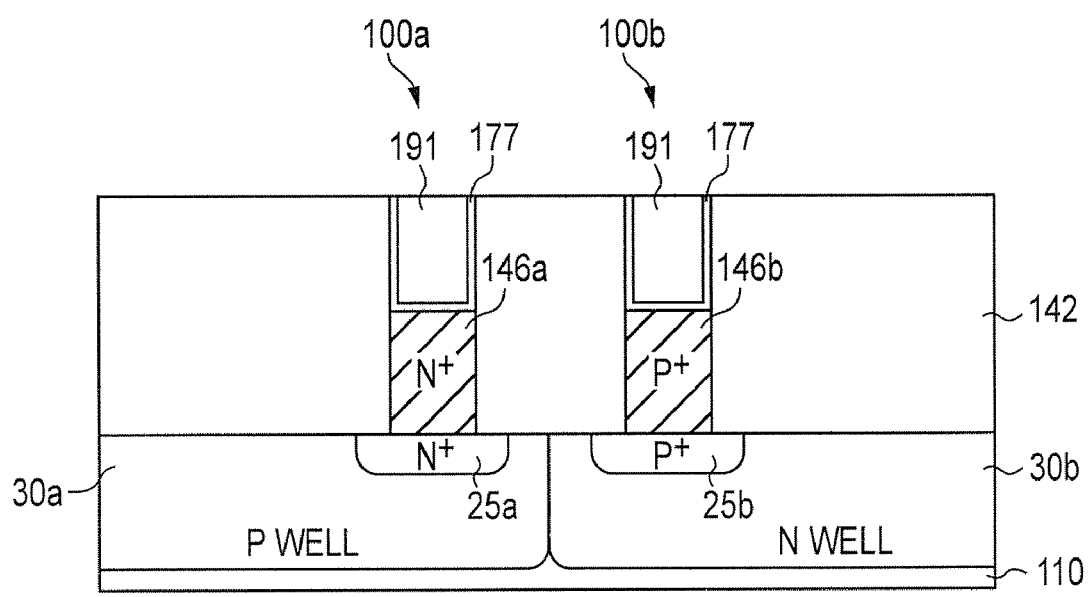
FIG. 16 is a schematic illustration of two low leakage polysilicon contacts in accordance with another embodiment of the present invention.

Although the embodiments of the invention have been described with reference to the formation of a low leakage polysilicon contact 100 comprising the n+ doped polysilicon region 146 provided in direct contact with the n+ floating diffusion region 25 formed within p-type substrate 110, it must be understood that the invention is not limited to this embodiment. Accordingly, the invention has equal applicability to complementary structures employing a p+ doped polysilicon region as part of a low leakage p+ doped polysilicon contact and in direct contact with a p+ floating diffusion region formed within an n-type substrate. Of course, the dopant and conductivity type of all structures will change accordingly, with the transfer gate corresponding to a PMOS transistor. FIG. 16 schematically illustrates two low leakage polysilicon contacts 100a and 100b formed according to the present invention. Low leakage polysilicon contacts 100a comprises n+ doped polysilicon region 146a provided in direct contact with the n+ doped region 25a, while low leakage polysilicon contacts 100b comprises p+ doped polysilicon region 146b provided in direct contact with the p+ doped region 25b. N+ doped region 25a is provided within a p-type well 30a, while p+ doped region 25b is provided within an n-type well 30b. Metal regions 191 are provided over both the n+ doped polysilicon region 146a and p+ doped polysilicon region 146b. The invention also contemplates embodiments wherein some or all of contacts to N+ junctions are n+ poly/metal-plug or wherein some or all of contacts to P+ junctions are p+ poly/metal-plug.

Further, although the embodiments of the invention have been described with reference to the formation of low leakage polysilicon contact 100 formed over a floating diffusion region (such as the floating diffusion region 25 of the pixel cell 10 of FIGS. 1-13), the invention also contemplates the formation of the low leakage polysilicon contact over other leakage sensitive areas of the pixel cell 10. For example, the invention also contemplates embodiments in which a low leakage polysilicon contact is formed in direct contact with a charge collection region, such as charge collection region 21 of pixel cell 10 of FIGS. 1-13. Further, although the embodiments of the invention have been described with reference to the formation of only one low leakage polysilicon contact (such as the low leakage polysilicon contact 100 formed over the floating diffusion region 25 of the pixel cell 10 of FIGS. 1-13), the invention contemplates the formation of a plurality of such low leakage polysilicon contacts over one or a plurality of leakage sensitive regions of a CMOS pixel cell. The invention also contemplates the formation of at least one low leakage polysilicon contact to transistor gates, capacitors or resistors. The invention further contemplates the formation of low leakage polysilicon contacts having various shapes and geometries, for example, slotted contacts or contact channels, among others.

The above description and drawings are only to be considered illustrative of exemplary embodiments, which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A method of forming an imaging device having at least one contact region with decreased current leakage, comprising the steps of:
   forming at least one photosensor in a substrate;
   forming at least one gate structure over said substrate;
   forming at least one leakage sensitive region within said substrate;
   forming at least one doped region within said substrate, said doped region being laterally displaced from said leakage sensitive region within said substrate;
   providing at least one polysilicon contact in direct contact with said at least one leakage sensitive region; and
   providing at least one metal contact in contact with said at least one doped region.

2. The method of claim 1, wherein said step of providing at least one polysilicon contact further comprises:
   providing an insulating layer over said gate structure;
   forming a first opening in said insulating layer, said first opening communicating with said at least one leakage sensitive region;
   providing doped polysilicon material to partially fill said first opening and to form said doped polysilicon region and a partially-filled first opening;
   forming a second opening in said insulating layer, said second opening communicating with said at least one doped region; and
   providing a metal layer within said partially-filled first opening to form a metal region over said doped polysilicon region, and within said second opening to form said metal contact.

3. The method of claim 2, wherein said steps of providing at least one polysilicon contact and providing at least one metal contact are conducted simultaneously.

4. The method of claim 3, wherein said step of providing a metal region over said doped polysilicon region is conducted simultaneously with said step of providing said at least one metal contact in contact with said at least one doped region.

5. The method of claim 3, wherein said step of providing said metal layer comprises depositing a metal selected from the group consisting of tungsten, titanium, cobalt, tantalum, molybdenum and platinum.

6. The method of claim 1, wherein said at least one leakage sensitive region is one of a floating diffusion region and a charge collection region.

7. The method of claim 1, wherein said imaging device is one of a 3T, 4T, 5T, 6T and 7T imaging device.

8. The method of claim 1, wherein said imaging device is a CMOS imager.

9. The method of claim 1, wherein said imaging device is a CCD imager.

10. The method of claim 1, wherein said insulating layer is formed to a thickness of about 2,000 Angstroms to about 50,000 Angstroms.

* * * * *